(12) United States Patent
Drescher et al.

(10) Patent No.: US 6,960,541 B2
(45) Date of Patent: Nov. 1, 2005

(54) PROCESS FOR FABRICATION OF A SEMICONDUCTOR COMPONENT HAVING A TUNGSTEN OXIDE LAYER

(75) Inventors: Dirk Drescher, Langebrück (DE); Helmut Tews, Poughkeepsie, NY (US); Martin Schrems, Langebrück (DE); Helmut Wurzer, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/906,338

(22) Filed: Jul. 16, 2001

(65) Prior Publication Data

US 2002/0070414 A1 Jun. 13, 2002

Related U.S. Application Data

(63) Continuation of application No. PCT/DE00/00047, filed on Jan. 5, 2000.

(30) Foreign Application Priority Data

Jan. 14, 1999 (DE) .......................................... 199 01 210

(51) Int. Cl.$^7$ .............................................. H01L 21/31
(52) U.S. Cl. ...................................... 438/785; 438/635
(58) Field of Search ................................ 438/785, 799, 438/682–685, 635, 582–583

(56) References Cited

U.S. PATENT DOCUMENTS

| | | | | |
|---|---|---|---|---|
| 4,377,734 A | * | 3/1983 | Mashiko et al. | 219/121.41 |
| 4,505,028 A | * | 3/1985 | Kobayashi et al. | 438/301 |
| 4,522,936 A | * | 6/1985 | Kukes et al. | 502/249 |
| 4,965,594 A | * | 10/1990 | Komuro | 347/62 |
| 5,075,251 A | * | 12/1991 | Torres et al. | 438/664 |
| 5,089,432 A | * | 2/1992 | Yoo | 438/231 |
| 5,189,503 A | * | 2/1993 | Suguro et al. | 257/310 |
| 5,348,894 A | * | 9/1994 | Gnade et al. | 438/396 |
| 5,358,899 A | * | 10/1994 | Fleischman et al. | 438/605 |
| 5,444,011 A | * | 8/1995 | Taniguchi | 438/396 |
| 5,541,131 A | * | 7/1996 | Yoo et al. | 148/DIG. 147 |
| 5,650,041 A | * | 7/1997 | Gotoh et al. | 134/1.3 |
| 5,744,832 A | * | 4/1998 | Wolters et al. | 257/295 |
| 6,001,718 A | * | 12/1999 | Katata et al. | 438/303 |
| 6,140,167 A | * | 10/2000 | Gardner et al. | 438/197 |
| 6,162,717 A | * | 12/2000 | Yeh | 438/595 |
| 6,162,741 A | * | 12/2000 | Akasaka et al. | 438/773 |
| 6,168,958 B1 | * | 1/2001 | Gardner et al. | 438/3 |
| 6,180,481 B1 | * | 1/2001 | Deboer et al. | 438/396 |
| 6,204,203 B1 | * | 3/2001 | Narwankar et al. | 438/785 |
| 6,222,214 B1 | * | 4/2001 | Wuu et al. | 257/296 |
| 6,281,126 B1 | * | 8/2001 | Arakawa | 438/682 |
| 6,284,646 B1 | * | 9/2001 | Leem | 438/629 |
| 6,291,868 B1 | * | 9/2001 | Weimer et al. | 257/413 |
| 6,498,097 B1 | * | 12/2002 | Park et al. | 438/686 |
| 6,635,523 B1 | * | 10/2003 | Uchiyama et al. | 438/239 |

FOREIGN PATENT DOCUMENTS

| | | | | |
|---|---|---|---|---|
| EP | 0 418 540 A2 | | 3/1991 | |
| JP | 07135202 | * | 9/1993 | ......... H01L/21/314 |
| JP | 07135202 | | 5/1995 | |
| KR | 9 210 669 | | 12/1992 | |
| KR | 9 402 740 | | 3/1994 | |

* cited by examiner

*Primary Examiner*—Long Pham
*Assistant Examiner*—Thao X. Le
(74) *Attorney, Agent, or Firm*—Laurence A. Greenberg; Werner H. Stemer; Ralph E. Locher

(57) ABSTRACT

A semiconductor element with at least one layer of tungsten oxide, optionally in a structured tungsten oxide layer, is described. The semiconductor element is characterized in that the relative premittivity of the tungsten oxide layer is higher than 50.

6 Claims, 2 Drawing Sheets

PROCESS FOR FABRICATION OF A SEMICONDUCTOR COMPONENT HAVING A TUNGSTEN OXIDE LAYER

CROSS-REFERENCE TO RELATED APPLICATION

This application is a continuation of copending International Application No. PCT/DE00/00047, filed Jan. 5, 2000, which designated the United States.

BACKGROUND OF THE INVENTION

FIELD OF THE INVENTION

The invention relates to a semiconductor component and to processes for its fabrication. The invention relates in particular to a semiconductor component with a gate dielectric of a field-effect transistor and/or with a storage node dielectric in a memory cell.

In order to maintain or increase international competitiveness, it is necessary to continually reduce the costs that have to be expended to realize a specific electronic function, and thus to continuously increase productivity. The guarantor for increasing productivity in recent years has been and remains CMOS technology or DRAM technology. These two technologies have been able to increase productivity by progressive miniaturization.

However, the progressive miniaturization of MOS transistors entails the necessity of using ever thinner dielectric layers as gate dielectrics for effective driving of the transistors. If, as is generally customary nowadays, silicon dioxide is used as the gate dielectric, then the layer thickness of the gate dielectric in 0.1 $\mu$m technology would have to be less than 1.5 nm. However, it is very difficult to produce such thin silicon dioxide layers reproducibly with sufficient accuracy. Deviations of just 0.1 nm mean fluctuations in the layer thickness of the order of magnitude of 10%. Furthermore, in the case of such thin silicon dioxide layers, high leakage currents arise through the silicon dioxide layer, since, through the quantum mechanical tunnel effect, the charge carriers can surmount the potential barrier produced by the silicon dioxide layer.

In the development of large-scale integrated memory components, the cell capacitance of an individual memory cell must be maintained or even improved despite progressive miniaturization. In order to achieve this aim, ever thinner dielectric layers, usually silicon oxide or oxide-nitride-oxide layers (ONO), and folded capacitor electrodes (trench cell, stack cell) are also being used. However, the reduction in the thickness of the storage dielectric leads to a considerable increase in the leakage currents (tunneling currents) through the dielectric. It has been proposed, therefore, to replace the customary silicon dioxide layers or oxide-nitride-oxide layers by materials having a higher relative dielectric constant ($\in_r$). With such a material, comparatively thick layers of more than 5 nm can be used as the gate dielectric or the storage dielectric, which, however, correspond electrically to a silicon dioxide layer of distinctly smaller than 5 nm. The thickness of such a layer is easier to control and the tunneling current through the layer is distinctly reduced.

By way of example, titanium oxide or tantalum pentoxide or layer stacks of oxide/titanium oxide or oxide/tantalum pentoxide have been proposed as materials for the gate dielectric. By way of example, barium strontium titanate (BST, (Ba,Sr)TiO$_3$), lead zirconate titanate (PZT, Pb(Zr,Ti)O$_3$) or lanthanum-doped lead zirconate titanate or strontium bismuth tantalate (SBT, SiBi$_2$Ta$_2$O$_9$) are used as materials for the storage dielectric.

Unfortunately, these materials have a number of drawbacks for their new uses. For example, it is customary to use chemical vapor deposition (CVD) processes for the fabrication of a gate dielectric from titanium oxide or tantalum pentoxide.

However, the layers fabricated in this way have impurities that are attributable to the process gases used in the CVD processes. These impurities lead to charges and traps in the layers, which in turn have an adverse effect on the operation of the transistor. Moreover, these layers or layer stacks generally do not produce a sufficient increase in the dielectric constant ($\in_r$).

With the new materials which are used as storage dielectrics, it has been found that they belong to the group of materials which cannot be etched or can only be etched with difficulty by chemical methods, in which materials the etching abrasion, even when using "reactive" gases, is based primarily or almost exclusively on the physical part of the etching. On account of the small or absent chemical component of the etching, the etching abrasion of the layer to be structured is of the same order of magnitude as the etching abrasion from the mask or the base layer (etching stop layer), i.e. the etching selectivity with respect to the etching mask or base layer is generally low (between approximately 0.3 and 3.0). Consequently, the erosion of the masks with inclined flanks and the inevitable facet formation (beveling, tapering) on the masks results in that only a low dimensional accuracy of the structuring can be ensured. Therefore, this faceting restricts the smallest structure sizes that can be achieved during the structuring and the steepness of the profile flanks that can be achieved in the layers that are to be structured.

Furthermore, complicated and expensive deposition processes and barrier layers which are difficult to process, such as platinum or ruthenium, are necessary for the fabrication of BST, PZT or SBT layers. Moreover, on account of lack of thermal stability, BST layers cannot be used for deep trench capacitors.

SUMMARY OF THE INVENTION

It is accordingly an object of the invention to provide a semiconductor component and a process for its fabrication which overcomes the above-mentioned disadvantages of the prior art devices and methods of this general type.

With the foregoing and other objects in view there is provided, in accordance with the invention, a semiconductor component containing at least one tungsten oxide layer having a relative dielectric constant of greater than 50.

According to the invention, a semiconductor component with at least one layer of tungsten oxide (WO$_x$), if appropriate a structured layer of tungsten oxide (WO$_x$), is provided. The semiconductor component according to the invention is characterized in that the relative dielectric constant ($\in_r$) of the tungsten oxide layer (WO$_x$) is greater than 50.

The semiconductor component according to the invention has the advantage that very high relative dielectric constants ($\in_r$) can be achieved relatively easily with tungsten oxide layers (WO$_x$), for example x=2–3. Furthermore, the semiconductor component according to the invention has the advantage that the installations that have previously been employed in semiconductor engineering can also be used to produce tungsten oxide layers (WO$_x$). There is no need to use specially adapted and therefore expensive installations.

The tungsten used to produce the tungsten oxide layers ($WO_x$) diffuses to only a very slight extent into silicon, so that there is only a low risk of contamination in the semiconductor component according to the invention. However, the use of tungsten oxide layers ($WO_x$) is not restricted to silicon technology, but rather these layers can also be used in combination with other semiconductors, for example GaAs.

The tungsten oxide layer ($WO_x$) is preferably used as a storage, gate, tunnel or STI liner dielectric.

Furthermore, it is preferable if the relative dielectric constant ($\in_r$) of the tungsten oxide layer is greater than 100, in particular greater than 150.

According to a further embodiment of the present invention, the semiconductor component has at least one layer stack containing a tungsten-containing layer and a tungsten oxide layer ($WO_x$), if appropriate a structured layer stack containing a tungsten-containing layer and a tungsten oxide layer ($WO_x$).

Furthermore, it is preferable if the semiconductor component has at least one layer stack containing a tungsten oxide layer ($WO_x$) and at least one barrier layer, if appropriate a structured layer stack containing a tungsten oxide layer ($WO_x$) and at least one barrier layer.

The tungsten-rich layer is preferably formed from tungsten, tungsten silicide or tungsten nitride.

Furthermore, it is preferable if the barrier layer is formed from silicon oxide, silicon nitride, oxynitride, tungsten nitride or titanium nitride.

Furthermore, the invention provides a process for fabricating a semiconductor component that has a tungsten oxide layer.

The process according to the invention is characterized by the following steps:
a) a tungsten-containing layer is provided,
b) the tungsten-containing layer is thermally oxidized in an oxygen-containing atmosphere, and
c) the layer of tungsten oxide is subjected to a heat treatment at a temperature of between 550 and 1100° C., preferably 700 to 1100° C., so that a layer of tungsten oxide ($WO_x$) with a relative dielectric constant ($\in_r$) of greater than 50 is produced.

Furthermore, the invention provides a further process for fabricating a semiconductor component that has a tungsten oxide layer. The process according to the invention is characterized by the following steps:
a) a tungsten-containing layer is provided, and
b) the tungsten-containing layer is thermally oxidized in an oxygen-containing atmosphere, so that a layer of tungsten oxide ($WO_x$) with a relative dielectric constant ($\in_r$) of greater than 50 is produced.

A layer of tungsten, tungsten silicide or tungsten nitride is preferably used as the tungsten-containing layer.

Furthermore, it is preferable if the tungsten-containing layer is provided using a CVD process or a PVD process.

Furthermore, it is preferable if the tungsten-containing layer is thermally oxidized at a temperature of 500 to 1200° C.

According to a further embodiment of the present invention, after the thermal oxidation the layer of tungsten oxide ($WO_x$) is subjected to a heat treatment at a temperature of between 550 and 1100° C., preferably 700 to 1100° C. The heat treatment is preferably carried out in an inert atmosphere.

Furthermore, the invention provides a further process for fabricating a semiconductor component that has a tungsten oxide layer. The process according to the invention is characterized by the following steps:
a) a surface of the semiconductor component is prepared; and
b) tungsten fluoride and water are guided onto the surface in the gaseous state, so that a layer of tungsten oxide ($WO_x$) is produced.

The layer of tungsten oxide ($WO_x$) is preferably subjected to a heat treatment at a temperature of between 550 and 1100° C., preferably 700 to 1100° C. In this case, it is particularly preferable if the heat treatment is carried out in an inert atmosphere.

Although tungsten oxide layers can be structured considerably more easily than, for example, ferroelectric layers or platinum layers, tungsten oxide layers nevertheless belong to the group of layers which, with conventional structuring processes, can substantially only be etched by a physical etching component and which accordingly have only a low degree of selectivity with respect to other layers. Therefore, it is a further object of the present invention to specify a process for fabricating a structured tungsten oxide layer.

In this case, the invention provides a process for fabricating a structured tungsten oxide layer. The process according to the invention is characterized by the following steps:
a) a tungsten oxide layer is provided,
b) a mask is applied to the tungsten oxide layer, and
c) the tungsten oxide layer is subjected to dry etching in accordance with the mask in an oxidizing atmosphere at a temperature greater than 130° C., the oxidizing atmosphere containing at least one halogen compound, in particular $CF_4$.

The process according to the invention has the advantage that the tungsten oxide layer can be dry etched substantially by chemical methods, even without a physical etching component. Accordingly, the process according to the invention has a high degree of selectivity with respect to other materials, such as for example silicon or silicon oxide.

Furthermore, it is preferable if the mask is a polysilicon mask.

Furthermore, it is preferable if the etching temperature is between 200° C. and 300° C., in particular about 250° C. And it is particularly preferred if the proportion of the halogen compound in the oxidizing atmosphere is between 1 and 10%.

Other features which are considered as characteristic for the invention are set forth in the appended claims.

Although the invention is illustrated and described herein as embodied in a semiconductor component and a process for its fabrication, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED
EMBODIMENTS

Figure 1:
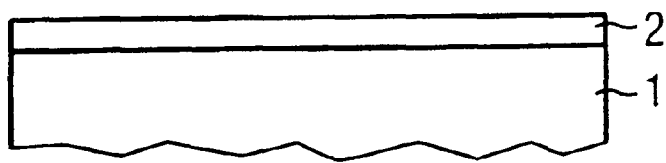
FIGS. 1 to 4 and 7 are diagrammatic, sectional views depicting one embodiment of a process according to the invention.

In all the figures of the drawing, sub-features and integral parts that correspond to one another bear the same reference symbol in each case. Referring now to the figures of the drawing in detail and first, particularly, to FIG. 1 thereof, there is shown part of a silicon wafer with a silicon substrate 1. The state of a silicon wafer that is shown in FIG. 1 corresponds, for example, to the state which a silicon wafer adopts in a standard CMOS process after the wells of the CMOS transistors and the isolation (not shown) of the individual transistors have already been produced.

Then, a silicon dioxide layer 2, which is approximately 1 to 5 nm thick, is applied to a surface of the silicon substrate 1 as a barrier layer. The oxide layer 2 may be produced, for example, by thermal oxidation. If the thermal oxidation is carried out in an atmosphere which additionally contains NO or $N_2O$ molecules, it is possible to produce a nitrided silicon dioxide layer 2. Silicon dioxide layers have an extremely low trap density, which has positive effects on the operation of the transistor that is still to be produced.

As has already been mentioned in the introduction, it is difficult to accurately control the thickness of such a thin oxide layer. However, since the oxide layer is only a precursor to the production of the actual gate dielectric, it is possible to accept fluctuations in the layer thickness of the oxide layer 2 without this having adverse effects on the operation of the transistor which is still to be produced.

Next, a tungsten-containing layer 3 is applied to the oxide layer 2. The tungsten-containing layer 3 may be a pure tungsten layer, a tungsten nitride layer or a tungsten silicide layer. The tungsten-containing layer 3 is produced, for example, by a sputtering process (PVD process) or by a chemical vapor deposition (CVD) process.

If a CVD process is to be used, it is possible to employ a number of processes:

CVD W (on silicon, nonselective)
    e.g. $WF_6+SiH_4 \rightarrow W+gases$ (seed layer)
    e.g. $WF_6+H_2 \rightarrow W+gases$ (bulk layer)
CVD W (on silicon, selective with respect to nitride, oxide):
    e.g. $2\ WF_6 + 3\ Si \rightarrow 2\ W + 3\ (SiF_4)$
    (a process of this type is described by R. V. Joshi et al., in J. Appl.Phys. 71(3) 1 Feb. 1992, pp. 1428)
    e.g. $WF_6+H_2 \rightarrow W+gases$
CVD $WSi_x$:
    e.g. $WF_6+SiH_2Cl_2 \rightarrow WSi_x$ (e.g. x=2–3)+gases
    (likewise R. V. Joshi et al., J. Appl.Phys. 71(3) 1 Feb. 1992, pp. 1428)
CVD WN (tungsten nitride, e.g. $W_2N$):
    e.g. $4\ WF_6+N_2+12H_2$ (Plasma CVD)$\rightarrow 4\ W_2N+24\ (HF)$
    (e.g. at a temperature of 350–400° C.)

Figure 2:
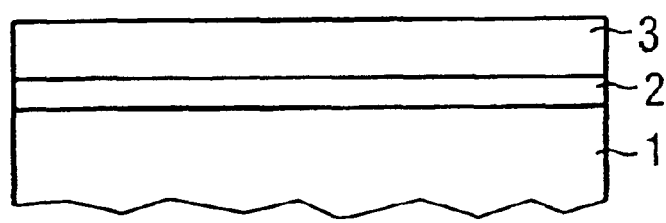

The layer thickness of the tungsten-containing layer 3 produced in this way is approximately 10 to 20 nm. The resulting situation is shown in FIG. 2.

Then, the tungsten-containing layer 3 is converted into a tungsten oxide layer 3' by a thermal oxidation. The conversion takes place in an oxygen atmosphere (for example $O_2$ or $H_2O$) at a temperature of 500 to 1200° C. When using a pure tungsten layer or when using a tungsten silicide layer, the temperature should not exceed approximately 600° C. or what is known as a low thermal budget rapid thermal oxidation (RTO) should be carried out, in order to prevent silicon from diffusing into the tungsten-containing layer 3 and the tungsten-containing layer 3 from being oxidized.

The thermal oxidation of the tungsten-containing layer 3 leads to a tungsten oxide layer 3' which has scarcely any impurities and a relative dielectric constant ($\in r$) of greater than 50. The layers and the process parameters may be selected in such a way that the tungsten-containing layer 3 is completely converted into the tungsten oxide layer 3' or that part of the tungsten-containing layer 3 is not oxidized.

By a subsequent heat treatment at a temperature of approximately 550 to 1100° C. in an inert atmosphere, it is possible to produce a tungsten oxide layer 3' ($WO_x$, for example x=2–3) in a crystalline or sintered phase (for example phases with an orthorhombic or tetragonal symmetry). The heat treatment may take place immediately after the production of the tungsten oxide layer 3', but may also only be carried out in a later process step during the fabrication of an integrated circuit.

Figure 3:
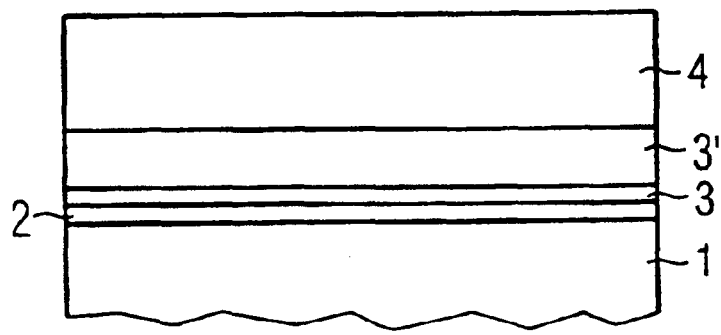
Figure 7:
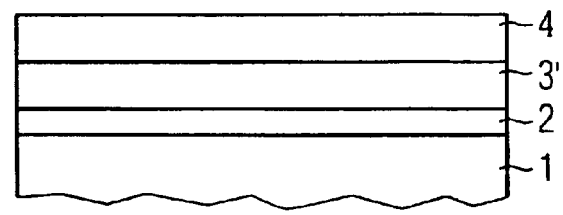

The layer stack shown in FIG. 3 is eminently suitable for use in an MOS transistor since, as has already been mentioned, the silicon dioxide layer 2 (barrier layer) has an extremely low trap density. For a storage dielectric, this is not absolutely necessary, so that for this application it is also possible to dispense with the silicon dioxide layer 2. Any part of the tungsten-rich layer 3 (for example tungsten nitride) that remains after the thermal oxidation is then responsible for the function of a (conductive) barrier layer. In this way, it is possible to achieve a very high capacitance using a simple and inexpensive procedure. A corresponding layer stack containing a conductive tungsten nitride layer 2 (barrier layer and lower electrode), tungsten oxide layer 3' and a conductive tungsten nitride layer 4 (upper electrode) on a silicon substrate 1 is shown in FIG. 7.

Next comes the production of the conductive layer 4 on the tungsten oxide layer 3'. The resulting situation is shown in FIG. 3. Depending on the process used, however, it is also possible for a further barrier layer, for example a tungsten nitride layer (not shown), to be deposited before the conductive layer 4. The conductive layer 4 forms, for example, the gate electrode of an MOS transistor and usually consists of doped polysilicon.

There follows a photographic technique in which the polysilicon layer 4 is structured so that gate tracks 5 are produced. The gate tracks 5 in turn form a mask for the subsequent etching of the tungsten oxide layer 3'. A mixture of $CF_4$ and $O_2$ is used as the etching gas. The temperature of the etching is approximately 250° C. In the process, the etching gas is excited to form a plasma by the introduction of HF or by microwave excitation. The ratio of $CF_4$ to $O_2$ is approximately 2% to 98%.

Figure 4:
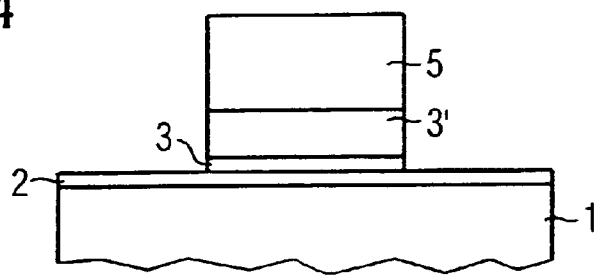

The fluorine that is released and the associated reaction of the tungsten oxide with the fluorine are responsible for the etching itself. Volatile tungsten/fluorine compounds are formed. The oxygen acts as a passivator for the (poly) silicon. Oxygen causes the formation of $SiO_2$, the bonding energy of which (without the use of additional ion energy) is too high to be etched to any significant extent by the small proportion of fluorine. Therefore, the etching of the tungsten oxide layer takes place highly selectively with respect to (poly)silicon and with respect to silicon oxide. The resulting situation is shown in FIG. 4.

The process for producing the transistor can then be continued in accordance with a standard CMOS process in order to produce the complete transistor. These steps are known per se and consequently require no further explanation.

Figure 5:
FIGS. 5 and 6 are sectional views depicting a further embodiment of the process according to the invention.

FIG. 5 shows part of a silicon wafer with the silicon substrate 1 for explaining a second embodiment of the process according to the invention. The state of a silicon wafer shown in FIG. 5 once again corresponds to the state that a silicon wafer adopts in a standard CMOS process after the wells of the CMOS transistors and the isolation (not shown) of the individual transistors have been produced.

Next, the tungsten oxide layer 3' is applied directly to the silicon substrate 1. The tungsten oxide layer 3' is produced by a CVD process. For this purpose, tungsten fluoride and water are guided onto the substrate surface in the gaseous state as precursors:

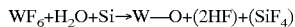

This leads to the deposition of a tungsten oxide layer 3' which is approximately 2–20 nm thick.

By a subsequent heat treatment at a temperature of approximately 550 to 1100° C. in an inert atmosphere, it is possible to produce a tungsten oxide layer 3' (WO$_x$, for example x=2–3) in a crystalline or sintered phase (for example phases with an orthorhombic or tetragonal symmetry). The heat treatment may immediately follow the production of the tungsten oxide layer 3', but may also only be carried out in a subsequent process step during the fabrication of an integrated circuit. The resulting situation is shown in FIG. 5.

Figure 6:
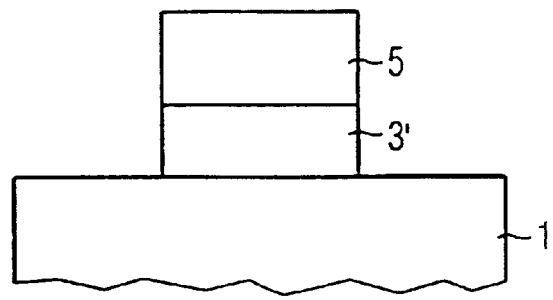

This is followed by the production of a conductive layer on the tungsten oxide layer 3'. However, depending on the process used, it is also possible for a further barrier layer, for example a tungsten nitride layer (not shown), to be deposited before the conductive layer. The conductive layer and the tungsten oxide 3' can then in turn be structured as has already been described in connection with FIG. 4. The resulting situation is shown in FIG. 6.

We claim:

1. A process for fabricating a semiconductor component, which comprises the steps of:
   providing a tungsten-containing layer using a process selected from the group consisting of chemical vapor deposition processes using inorganic tungsten precursors and physical vapor deposition processes;
   thermally oxidizing the tungsten-containing layer in an oxygen-containing atmosphere resulting in a formation of a layer of tungsten oxide having a relative dielectric constant of greater than 50; and
   subjecting the tungsten oxide to a heat treatment at a temperature of between 550 and 1100° C., after the step of thermally oxidizing the tungsten-containing layer.

2. The process according to claim 1, which comprises forming the tungsten-containing layer from a material selected from the group consisting of tungsten, tungsten suicide and tungsten nitride.

3. The process according to claim 1, which comprises thermally oxidizing the tungsten-containing layer at a temperature of between 500 and 1200° C.

4. The process according to claim 1, which comprise after performing the thermally oxidizing step, subjecting the layer of tungsten oxide to a heat treatment at a temperature of between 700 and 1100° C.

5. The process according to claim 4, which comprises carrying out the heat treatment in an inert atmosphere.

6. A process for fabricating a semiconductor component, which comprises the steps of:
   providing a tungsten-containing layer using a process selected from the group consisting of chemical vapor deposition processes using inorganic tungsten precursors and physical vapor deposition processes;
   thermally oxidizing the tungsten-containing layer in an oxygen-containing atmosphere resulting in a formation of a layer of tungsten oxide; and
   subjecting the tungsten oxide to a heat treatment at a temperature of between 550 and 1100° C., after the step of thermally oxidizing the tungsten-containing layer, resulting in a formation of the layer of tungsten oxide having a relative dielectric constant of greater than 50.

* * * * *